United States Patent [19]

Okada

[11] Patent Number: 4,693,303
[45] Date of Patent: Sep. 15, 1987

[54] LIQUID COOLING MODULE WITH SPRINGY CONTACT ELEMENTS AND AN APERTURE PLATE SLIDABLE THEREOVER

[75] Inventor: Yoshikatsu Okada, Tokyo, Japan

[73] Assignee: NEC Corporation, Japan

[21] Appl. No.: 876,381

[22] Filed: Jun. 19, 1986

[30] Foreign Application Priority Data

Jun. 20, 1985 [JP] Japan .............................. 60-134842

[51] Int. Cl.⁴ .............................................. F28F 7/00
[52] U.S. Cl. .................................. 165/80.4; 165/80.2
[58] Field of Search ..................... 165/80.1, 80.2, 80.4

[56] References Cited

U.S. PATENT DOCUMENTS 4,341,432  7/1982  Cutchaw ........................ 165/80.4 X
4,381,032  4/1983  Cutchaw ........................ 165/80.4 X

OTHER PUBLICATIONS

Antonetti et al., Compliant Cold Plate Cooling Scheeme, IBM Tech. Disc. Bulletin, 11/78.

Primary Examiner—Albert W. Davis, Jr.
Assistant Examiner—Richard R. Cole
Attorney, Agent, or Firm—Laff, Whitesel, Conte & Saret

[57] ABSTRACT

A liquid cooling module comprises a substrate on which heat generating components to be cooled are mounted, a thermally conductive member secured to the substrate enclosing the heat generating components and a liquid cooling member having a chamber in which liquid is flowed. The thermally conductive member has a pair of two-motion coupling members one on each side thereof and the liquid cooling member has a pair of two-motion coupling members respectively engageable with the two-motion coupling members of the thermally conductive member when they are moved toward each other in a first direction and subsequently moved in a second direction with respect to each other normal to the first direction. An array of thermally conductive, springy contact elements are arranged between the thermally conductive member and the liquid cooling member. An aperture plate having an array of apertures corresponding to the contact elements is slidably mounted over the contact elements for holding the contact elements in compression to permit said members to move in the second direction and allowing the contact elements to partially extend through the corresponding apertures to establish thermal contact between the members.

6 Claims, 7 Drawing Figures

4,693,303

LIQUID COOLING MODULE WITH SPRINGY CONTACT ELEMENTS AND AN APERTURE PLATE SLIDABLE THEREOVER

BACKGROUND OF THE INVENTION

The present invention relates to liquid cooling of small heat generating electronic components.

A prior art liquid cooling module provides cooling of LSI (large-scale integration) chips mounted on one side of a ceramic substrate. The chips are respectively enclosed within recesses formed on one surface of a thermally conductive member which is in thermal contact with a liquid cooling member. Screws are used to couple the thermally conductive member and the cooling member together to ensure good face-to-face thermal contact therebetween. To provide efficient cooling by heat conduction, it is important that the screws should be fabricated to close tolerances for precision tightening and the surfaces of the thermally conductive member and the liquid cooling member be polished to a mirror finish. To provide completely flat mirror-finished surfaces, however, these contacting members must be of a thickness sufficient to prevent them from being warped by polishing processes, with a resultant decrease in thermal conduction efficiency. Another disadvantage is that utmost care should be exercised in tightening the screws so that the face-to-face contact between the contacting members are uniform at all points of the contact surfaces.

SUMMARY OF THE INVENTION

It is therefore an object of the present invention to provide a liquid cooling module which is efficient in heat conduction and simple in manufacture.

More specifically, the liquid cooling module of the invention comprises a substrate on which heat generating components to be cooled are mounted, a thermally conductive member secured to the substrate enclosing the heat generating components and a liquid cooling member having a chamber in which liquid is flowed. The thermally conductive member has a pair of two-motion coupling means one on each side thereof and the liquid cooling member has a pair of two-motion coupling means respectively engageable with the two-motion coupling means of the thermally conductive member when they are moved toward each other in a first direction and subsequently moved in a second direction with respect to each other normal to the first direction. An array of thermally conductive, springy contact elements are arranged between the thermally conductive member and the liquid cooling member. An aperture plate having an array of apertures corresponding to the contact elements is slidably mounted over the contact elements for holding the contact elements in compression to permit the coupling means of the thermally conductive member and liquid cooling member to move in the second direction when the aperture plate is in a first position and allowing the contact elements to partially extend through the corresponding apertures to establish thermal contact between the thermally conductive member and the cooling member when the slidable member is in a second position.

BRIEF DESCRIPTION OF THE DRAWINGS

The present invention will be described in further detail with reference to the accompanying drawings, in which.

DETAILED DESCRIPTION

Figure 1:
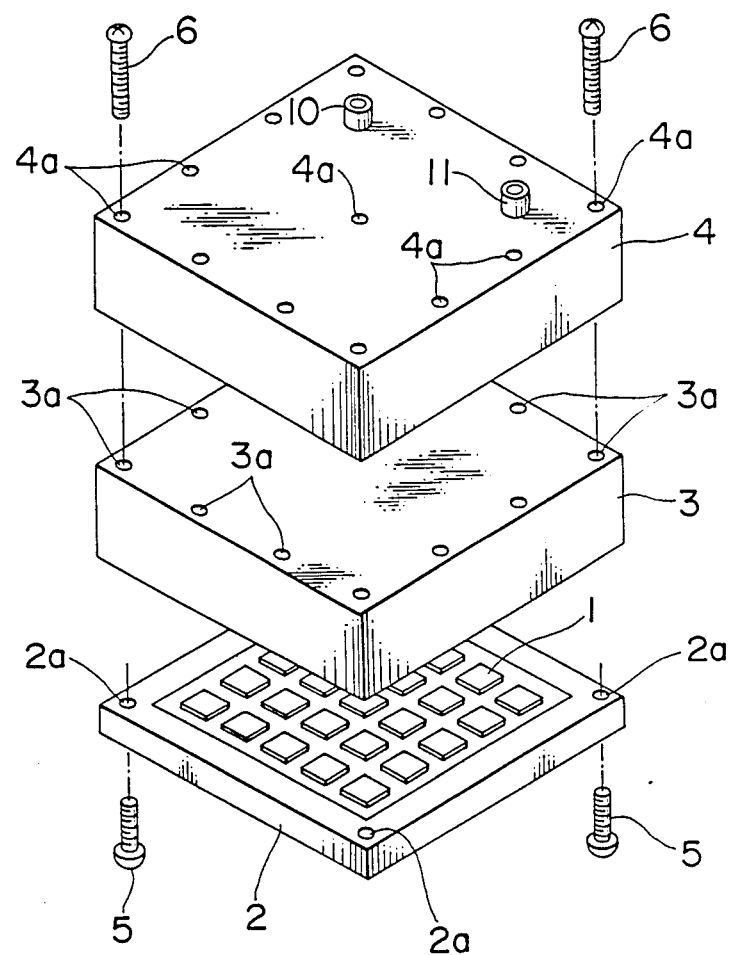
FIG. 1 is an exploded perspective view of a prior art liquid cooling module.
Figure 2:
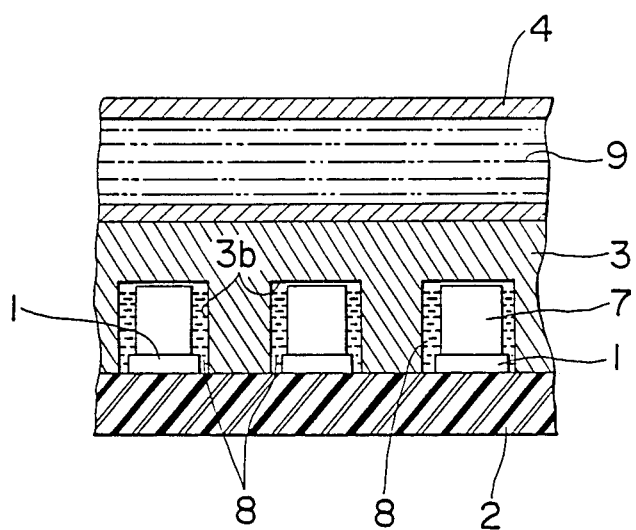
FIG. 2 is a cross-sectional view of a part of the prior art liquid cooling module.

Prior to the description of the present invention, reference is first made to FIGS. 1 and 2 in which is shown a prior art liquid cooling module for providing cooling of LSI chips 1 to be cooled. Chips 1 are mounted on one side of a ceramic substrate 2 which has holes 2a at the corners thereof for it to be coupled to a thermally conductive member 3 by screws 5. Thermally conductive member 3 is formed with a plurality of recesses 3b corresponding to chips 1, respectively. Thermally conductive elements 7 are disposed on chips 1 and immersed in thermally conductive liquid 8 within respective recesses 3b to provide efficient conduction of heat generated by the LSI chips 1 to the conductive member 3. Thermally conductive member 3 is in thermal contact with and cooled by a liquid cooling member 4 in which cooling liquid 9 is supplied from an inlet port 10 to an outlet port 11. To ensure intimate face-to-face thermal contact between the contacting members 3 and 4, a plurality of holes 4a are provided along the edges and at the center of the cooling member 4 to permit screws 6 to be threadably engage with threaded holes 3a on conductive member 3. To provide efficient conduction of heat from thermally conductive member 3 to cooling member 4, it is important that the screws 6 should be fabricated to close tolerances for precision tightening and that the surfaces of the contacting members 3 and 4 must be polished to a mirror finish. To provide completely flat mirror-finished surfaces, the contacting members must be of a thickness sufficient to prevent them from being warped by polishing processes. However, the increase in thickness tends to degrade the thermal conduction efficiency. Another disadvantage is that utmost care should be exercised in tightening the screws 6 so that the face-to-face contact between the contacting members 3 and 4 are uniform at all points of the contacting surfaces.

Figure 3:
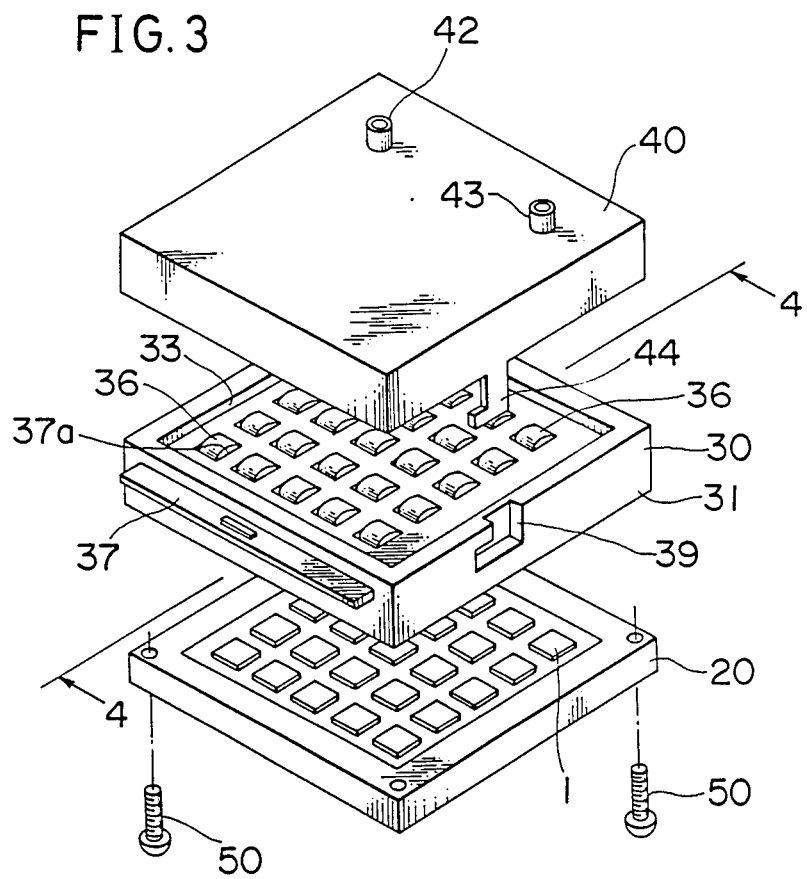
FIG. 3 is an exploded perspective view of a liquid cooling module according to the present invention.
Figure 4:
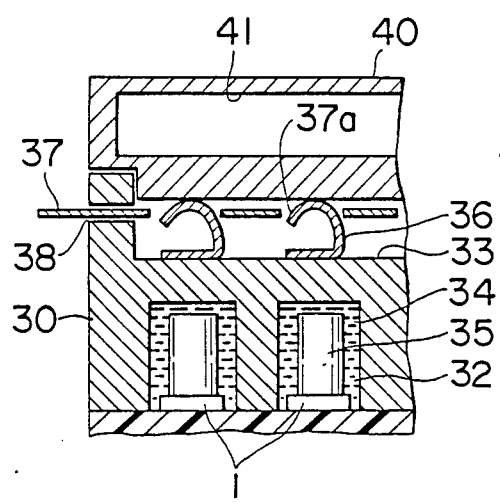
FIG. 4 is a cross-sectional view taken along the lines 4—4 of FIG. 3.

Referring to FIG. 3, there is shown a liquid cooling module according to an embodiment of the present invention. This cooling module comprises a ceramic substrate 20 on which LSI chips 1 are mounted. A thermal conducting member 30, which is coupled to the substrate 20 by screws 50, comprises a housing 31 formed with a plurality of recesses 32 on the lowerside thereof as illustrated in FIG. 4 and a rectangular recess 33 on the upperside thereof. Each of the lowerside recesses 32 is filled with thermally conductive liquid 34 in which a thermally conductive element 35 is disposed on the corresponding chip 1 to conduct heat generated by that chip to the housing 31. To the bottom surface of upperside recess 33 are secured thermally conductive spring elements 36 arranged in a matrix array in positions preferably corresponding to the locations of chips 1. Each spring element comprises a leaf spring having a lower flat end portion firmly secured to provide a high thermal conductivity path from the housing 31 to a liquid cooling member 40 and an upper curved end portion pressure-contacting with one surface of the cooling member 40. A slidable aperture plate 37 having an array of rectangular apertures 37a is slidably mounted through a slit 38 over the spring elements 36 so that each element 36 extends upward through a corresponding one of the apertures 37a into contact with the cooling member 40. Cooling member 40 has a chamber 41. Cooling liquid is supplied from inlet port 42 into the chamber 41 and discharged through the outlet port 43.

Figure 5:
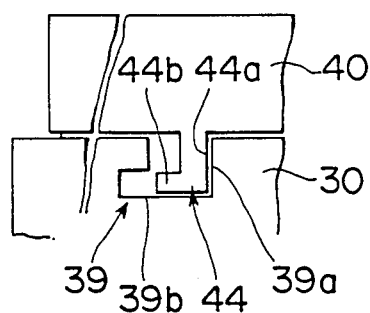
FIGS. 5 and 6 are side views of the cooling module of FIG. 3.
Figure 6:
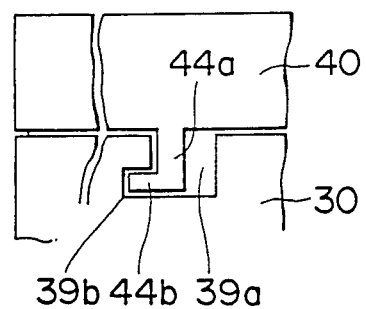

Thermal conducting member 30 is formed with a pair of notches 39 one on each side wall thereof and cooling member 40 is formed with a pair of lugs 44 extending downward from opposite side walls thereof for engaging with the notches 39. As shown in FIG. 5, the lug 44 has a vertically extending portion 44a and a horizontally extending portion 44b and the notch 39 has a vertically extending portion 39a and a horizontally extending portion 39b. The vertically extending portion 39a has a width slightly greater than the length of the horizontally extending portion 44b of the lug to permit the latter to engage with the notch simply by a snap action exerted on the cooling member 40 in a vertical direction and by a subsequent horizontal movement to the left to permit the horizontally extending portion 44b to engage with the horizontally extending portion 39b as illustrated in FIG. 6, thus establishing a thermal contact between the conducting member 30 and cooling member 40.

Figure 7:
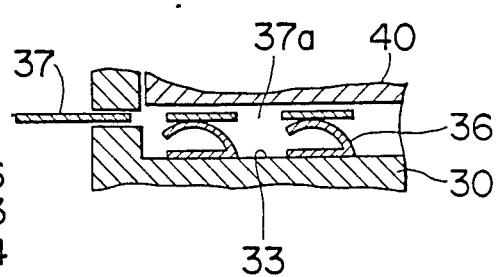
FIG. 7 is a cross-sectional view useful for describing the operation of the aperture plate.

Prior to the coupling between the two members 30 and 40, the slide aperture plate 37 is withdrawn slightly as indicated in FIG. 7 so that the thermal contact elements 36 are out of alignment with corresponding apertures 37a and held in compression under the slide plate 37. With the slide plate 37 being partially withdrawn, the two members 30 and 40 are brought together to insert the lugs 39 into the vertically extending portions 39a of the notches and then moved in a horizontal direction with respect to each other to insert the horizontally extending lug portions 44b into the horizontally extending notch portions 39b so that the conducting member 30 presents a flat surface. Therefore, there is substantially no frictional resistance during the horizontal slide movement. With the lugs 44 being engaged fully with the notches 44, the slide member 37 is pushed into the original position to permit thermal contact elements 36 to align with and extend through its apertures 37a into contact with the cooling member 40. Thermal contact elements 36 exert spring forces in a vertical direction. This establishes thermal contact between the members 30 and 40, while pressing the upper edges of horizontally extending lug portions 44b against the upper edges of the horizontally extending notch portions 39b to establish firm coupling between the members 30 and 40.

Therefore, surface polishing and screw-tightening processes are eliminated, so that the present invention allows a low-profile structure for the conducting member 30 and cooling member 40 to increase heat conduction efficiency and simplifies the manufacturing process with a resultant cost reduction.

What is claimed is:

1. A liquid cooling module for heat generating components, comprising:
    a substrate on which said heat generating components are mounted;
    a thermally conductive member secured to said substrate enclosing said heat generating components, the thermally conductive member having a pair of two-motion coupling means one on each side thereof;
    a liquid cooling member having a chamber in which liquid is flowed and a pair of two-motion coupling means respectively engageable with the two-motion coupling means of the thermally conductive member when said thermally conductive member and liquid cooling member are moved toward each other in a first direction and subsequently moved in a second direction with respect to each other normal to said first direction;
    an array of thermally conductive, springy contact elements arranged between said thermally conductive member and said liquid cooling member; and
    an aperture plate slidable between first and second positions and having an array of apertures corresponding to said contact elements for holding the contact elements in compression when the aperture plate is in said first position to permit said coupling means of said thermally conductive member and liquid cooling member to move in said second direction and allowing said contact elements to partially extend through the corresponding apertures to establish thermal contact between said thermally conductive member and said cooling member when the slidable member is in said second position.

2. A liquid cooling module as claimed in claim 1, wherein said heat generating components are electronic chips.

3. A liquid cooling module as claimed in claim 2, wherein said chips are LSI chips.

4. A liquid cooling module as claimed in claim 1, wherein each of said springy contact elements comprises a leaf spring having a flat end portion contacting one of said thermally conductive member and said liquid cooling member and a curved end portion contacting the other of said members through the corresponding aperture of said aperture plate.

5. A liquid cooling module as claimed in claim 4, wherein one of said thermally conductive member and said liquid cooling member is formed with a recess in which said array of springy contact elements is arranged and said aperture plate is slidable over the curved end portions of said contact elements.

6. A liquid cooling module as claimed in claim 1, wherein said thermally conductive member comprises a plurality of thermally conductive elements located respectively on said heat generating components, and a housing of thermally conductive material liquid-tightly coupled to said substrate, the housing having a plurality of recesses respectively enclosing said thermally conductive elements and said heat generating components, each of said recesses being filled with thermally conductive liquid to provide a high thermal conductivity path from each of said heat generating components to said housing.

* * * * *